United States Patent [19]
Kasperkovitz

[11] Patent Number: 5,113,419
[45] Date of Patent: May 12, 1992

[54] DIGITAL SHIFT REGISTER

[75] Inventor: Wolfdietrich G. Kasperkovitz, Eindhoven, Netherlands

[73] Assignee: U.S. Philips Corporation, New York, N.Y.

[21] Appl. No.: 298,211

[22] Filed: Jan. 13, 1989

Related U.S. Application Data

[63] Continuation of Ser. No. 381,088, May 24, 1982, abandoned.

[30] Foreign Application Priority Data

Jun. 11, 1981 [NL] Netherlands ............... 8102808

[51] Int. Cl.⁵ ............................................. G11C 19/00
[52] U.S. Cl. ............................ 377/75; 377/78; 377/120
[58] Field of Search ............... 377/75, 78, 120; 307/288

[56] References Cited

U.S. PATENT DOCUMENTS 2,957,091 10/1960 Pace .................................... 307/288
2,972,062 2/1961 Clark .................................... 377/111
3,056,044 9/1962 Kroos .................................... 377/111
3,329,834 7/1967 Klinikowski ........................ 377/77
3,670,179 6/1972 Pike ...................................... 377/78
3,676,701 7/1972 Kasperkovitz ..................... 377/78

Primary Examiner—John S. Heyman
Attorney, Agent, or Firm—Edward W. Goodman

[57] ABSTRACT

In a digital shift register comprising a series of substantially identical bistable circuits, a reference voltage required for the bistable circuits is generated by coupling a common node to the outputs of the bistable circuits via resistors, in such a way that the reference voltage is the means of the output voltages of the bistable circuits. Further, a method is described for the advanced presentation of information to the bistable circuits of the shift register via the reference circuit, so that the bistable circuits are changed over faster and the maximum clock frequency of the shift register is increased. By incorporating a gate circuit ahead of the shift register, a programmable frequency divider may thus be provided.

10 Claims, 3 Drawing Sheets

DIGITAL SHIFT REGISTER

This is a continuation of application Ser. No. 381,088, filed May 24, 1982, now abandoned.

BACKGROUND OF THE INVENTION

The invention relates to a digital shift register, which comprises a series of substantially identical bi-stable circuits, which each comprise a signal input, a reference level input, an output, and a clock signal input, the signal inputs of the second and subsequent bistable circuits of the series each being connected to the output of the preceding bistable circuit and the reference level inputs each being coupled to a common reference potential point, the register also including means for driving the clock signal inputs of each pair of adjacent bistable circuits in the series alternately with current pulses under the influence of a clock signal.

Such a digital shift register is known from U.S. Pat. No. 3,676,701. Said specification describes a digital shift register which can be integrated in a semiconductor body, the reference inputs of the bistable circuits being connected to a reference source, which is formed by means of a resistive voltage divider arranged between the power supply terminals of the circuit.

A disadvantage of this circuit is that the reference voltage is not constant, which may result in varying shifting times and a reduction of the noise immunity. The operating speeds of such shift registers are maximum if the logic swing (the difference in potential between the logic high and logic low level of an output) is approximately 250 mV. It will be evident that the reference voltage source should preferably have a low impedance in order to obtain a satisfactory noise immunity with such a small logic swing. In the ideal case the reference voltage $V_R$ would have to be equal to $(V_H+V_L)/2$. For more extensive shift registers of this kind, comprising a large number of bistable circuits, it is worthwhile to integrate a separate voltage-source circuit with the register in order to obtain a more stable reference voltage, but for smaller shift registers this is not an advantage. The reference source would then occupy a comparatively large surface area on the semiconductor body and would also consume a comparatively large portion of the total supply current of the shift register. Regardless of the number of bistable circuits, a further drawback is that, in order to suppress ripple on the reference input, the reference point should be decoupled by means of an external capacitor, because capacitors of a value required for this cannot be integrated. Obviously, this demands additional terminals on the casing of the integrated shift register. Dispensing with said ripple suppression would lead to a deterioration of the noise immunity.

SUMMARY OF THE INVENTION

It is an object of the invention to provide a digital shift register which is provided with means which render the reference voltage source superfluous, so that the surface area occupied by the shift register on the semiconductor body is reduced, the number of components required is reduced, and the circuit requires a smaller supply current.

A first embodiment of the digital shift register in accordance with the invention is characterized in that the outputs of the bistable circuits are each connected to a common node via a respective resistance in order to generate a reference potential at the common node. By coupling the common node to the outputs via resistances, the voltage on the common node is then the mean of the output voltages of the bistable circuits. Thus, an additional reference voltage source is not needed.

The digital shift register in accordance with the invention may further be characterized in that it comprises an input threshold circuit, having a signal input, a clock signal input, a first output, which is connected to the signal input of the first bistable circuits of the series, the clock signal input of the input threshold circuit and the clock signal input of said first bistable circuit being alternately drivable with current pulses under the influence of the clock signal, and the input threshold circuit further comprising a reference level input, which is connected to the common node, and a second output, on which a logic signal is available, which logic signal, at least when current is applied to the clock signal input of the input threshold circuit, is the inverse of a signal on the first output of the input threshold circuit, the outputs of the input threshold circuit each being connected to the common node via respective further resistances. The inclusion of said input threshold circuit provides a high-impedance system input and the further resistances provide additional smoothing of the voltage on the common node, which results in an improved noise immunity.

When the shift register comprises an even number of bistable circuits, the stability of the reference voltage may be further improved in accordance with the invention. The digital shift register in accordance with the invention is therefore characterized in that it includes means for driving said second output with current pulses, which are in phase with the current pulses applied to the clock signal input of the first bistable circuit. By applying, in accordance with the invention, suitable current pulses to a further output of the input threshold circuit, the behavior of the input threshold circuit relative to the common node will be similar to that of the combination of two adjacent bistable circuits.

A further embodiment of the digital shift register in accordance with the invention is characterized in that each of said respective resistances is provided with an intermediate tap, the couplings from the reference level inputs of the bistable circuits to the common node each comprising a connection from the relevant reference level input to the intermediate tap on the resistance corresponding to the bistable circuit (if present) which is disposed two places previously in the series. By means of these steps, the maximum frequency of the clock signal that can be used is increased.

When the digital shift register in accordance with the invention is equipped with an input threshold circuit as mentioned in the foregoing, it is advantageous to use the signal on the further output and the output of the input threshold circuit for driving the reference inputs of the first and the next bistable circuits, respectively. To this end the digital shift register in accordance with the invention is characterized in that each said further resistance is provided with an intermediate tap, the coupling from the reference level input of the first bistable circuit to the common node comprising a connection from this reference level input to the intermediate tap of the resistance connecting said second output to the common node and the coupling from the reference level input of the second bistable circuit to the common node comprising a connection from this reference level input to the intermediate tap on the resistance connecting said first output to said common node.

The digital shift register in accordance with the invention may be used advantageously in a programmable frequency divider circuit in which steps are taken to provide further parts of the circuit with a reference voltage in the manner in accordance with the invention and which comprises means for adjusting the factor by which the frequency of an applied input signal is divided. In order to obtain such a programmable frequency divider circuit, the digital shift register in accordance with the invention is characterized in that it is provided with an input gate circuit comprises a plurality of signal inputs, which each connected to the output of one of the bistable circuits, a plurality of reference level inputs each connected to the reference level input of one of the bistable circuits, a first output connected to the input of the first bistable circuit, a second output connected to the common node via a resistor, and at least two clock signal inputs, of which one input, depending on the position of a selector switch, can be driven with current pulses which are in phase opposition to the current pulses applied to the clock signal input of the first bistable circuit and the second output can be driven with current pulses which are in phase with the current pulses applied to the clock input of the first bistable circuit.

DESCRIPTION OF THE DRAWINGS

The operation of the digital shift register in accordance with the invention will be described in more detail with reference to the drawings, in which.

DESCRIPTION OF THE PREFERRED EMBODIMENTS

Figures 1, 2:
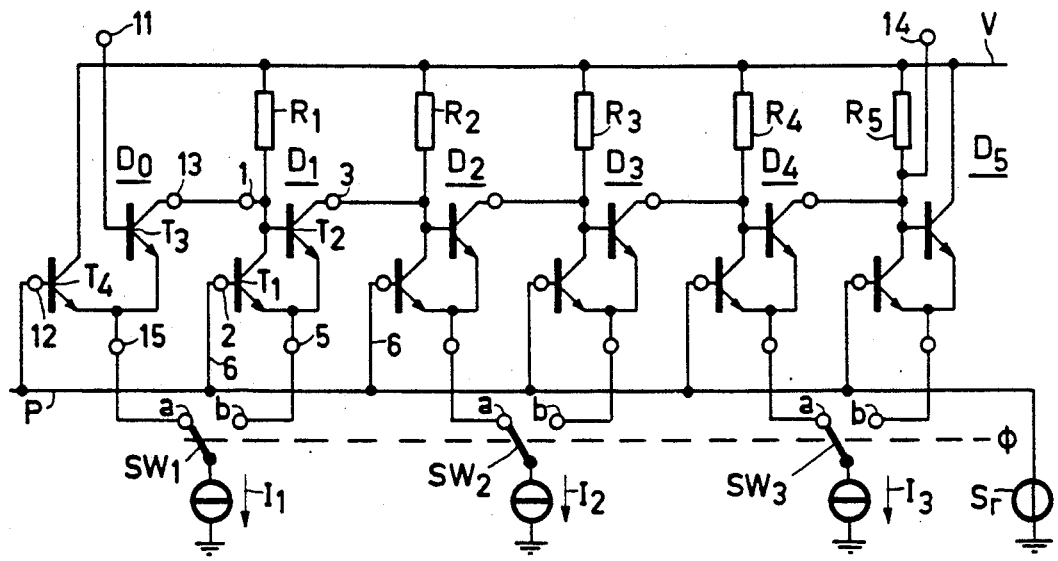
FIG. 1 shows the circuit diagram of a known digital shift register.
FIG. 2 shows the circuit diagram of a first embodiment of the digital shift register in accordance with the invention.

FIG. 1 shows the circuit diagram of a digital shift register as known from U.S. Pat. No. 3,676,701. This known shift register comprises the bistable circuits $D_1 \ldots D_5$, which each comprise a transistor pair $T_1, T_2$. The base of transistor $T_2$ and the collector of transistor $T_1$ of each bistable circuit are connected to the input node 1 thereof. Said node 1 is further connected to a power supply terminal V, which is common to all bistable circuits, via a resistor $R_1 \ldots R_5$. The input node 1 of each bistable circuit is connected to the collector of transistor $T_2$ of the preceding bistable circuit, which collector functions as an output 3, except for the input node 1 of the bistable circuit $D_1$, which is connected to the collector of transistor $T_3$ of an input threshold circuit $D_0$, which collector also functions as an output 13. The system input 11 of the circuit is connected to the base of transistor $T_3$. The base of transistor $T_3$ is not connected to the collector of transistor $T_4$, but for the remainder the input threshold circuit $D_0$ is idential to the bistable circuits $D_1 \ldots D_5$. As reference inputs (2 and 12, respectively), the bases of the transistors $T_1$ and the base of transistor $T_4$ are employed, which for this purpose are connected to the common node p, which is connected to the reference voltage source $S_r$. The emitters of each of the transistor pairs $T_1, T_2$ are connected to a clock input 5 and the emitters of the transistor pair $T_3, T_4$ are connected to a clock input 15. Said clock inputs 15 and the clock inputs 5 are respectively connected to switches $SW_1 \ldots SW_3$ for alternately applying current pulses derived from the current sources $I_1 \ldots I_3$ to every two adjacent bistable circuits. The input threshold circuit $D_0$ then constitutes the circuit which is adjacent to the bistable circuit $D_1$. The switches $SW_1 \ldots SW_3$ change over simultaneously with the rhythm of a clock signal $\phi$. Obviously, said switches $SW_1 \ldots SW_3$ can be realized in known manner by means of transistor pairs, the clock signal being applied to one base of the transistor pair or in phase opposition to both bases. The output 14 of the circuit is constituted by the input node of the last bistable circuit $D_5$. The information is shifted through the digital shift register in a manner to be described hereinafter. Assume that a logic 1 (high potential) is applied to the input 11 and that the switches $SW_1 \ldots SW_3$ are in position a. Transistor $T_3$ of the input threshold circuit $D_0$ will then conduct and hold the base of transistor $T_2$ of the bistable circuit $D_1$ at low potential. If switches $SW_1 \ldots SW_3$ are rapidly set to position b then, under the influence of the parasitic capacitance on the input node 1 of the bistable circuit $D_1$, the base of transistor $T_2$ of said circuit $D_1$ will remain low for a sufficiently long time to ensure that the last-mentioned transistor remains cut off, so that the current $I_1$ will flow through transistor $T_2$ of the bistable circuit $D_1$, the relevant input node 1 remains low, and the input node of the next bistable circuit $D_2$ remains or becomes high. Upon the next switching operation of the switches $SW_1 \ldots SW_3$ the information is finally transferred from the input node 1 of the bistable circuit $D_1$ to the input node of the bistable circuit $D_2$, which is attended by inversion (logic 1 becomes logic 0 and vice versa). Upon a further switching operation the original information is transferred to the input node of the bistable circuit $D_3$. It will be evident that this process may thus be continued and that the number of bistable circuits in the sequence may be selected at option.

The principal drawback of short integrated shift registers of this known type is that the reference source $S_r$ occupies a comparatively large surface area on the semi-conductor body and also demands a comparatively large power-supply current.

FIG. 2 illustrates the solution to this problem, which figure shows the circuit diagram of a first embodiment of the digital shift register in accordance with the invention. The reference source $S_r$ has been dispensed with and instead the common node p is connected to the outputs of the bistable circuits $D_1 \ldots D_5$ via resistors $R_{11}, R_{12} \ldots R_{15}$. Via resistors $R_{10}$ and $R_9$, the common node is connected, respectively, to the output 13 and the further output 17 of the input threshold circuit $D_0$. The common node p is now coupled to seven outputs in total, the resistors $R_9 \ldots R_{15}$ being suitably of equal value. The reference voltage $V_R$ on the common node p is obtained by averaging the seven output voltages. Depending on the length of the shift register (that is, the number of bistable circuits) and the ratio of the value $R_c$ of the collector resistors $R_0 \ldots R_6$ and the value $R_k$ of the resistors $R_9 \ldots R_{15}$ of the reference voltage $V_R$ will deviate from the ideal value $(V_H + V_L)/2$. In the shift register of FIG. 2, which, as shown, comprises 5 bistable circuits $D_1 \ldots D_5$ and an input threshold circuit $D_0$, the deviation is 6% for $R_k = R_c$. If $R_k = 10R_c$, the deviation is 10%. For larger numbers of bistable circuits the deviation is smaller. For example, for a shift register comprising 7 bistable circuits and one input threshold circuit, the deviation is 4% if $R_k = R_c$ and 8% if $R_k = 10 R_c$. The deviation inter alia affects the maximum attainable clock frequency. Computer simulations have demonstrated that a 10% deviation of $V_R$ from $(V_H + V_L)/2$ reduces the maximum clock frequency by 10%. This means that for comparatively short shift registers, as for example that of FIG. 2, and for moderate ratios $R_k/R_c$ substantially the same maximum clock frequency can be obtained as in a shift register with a separate reference voltage source.

Figure 3:
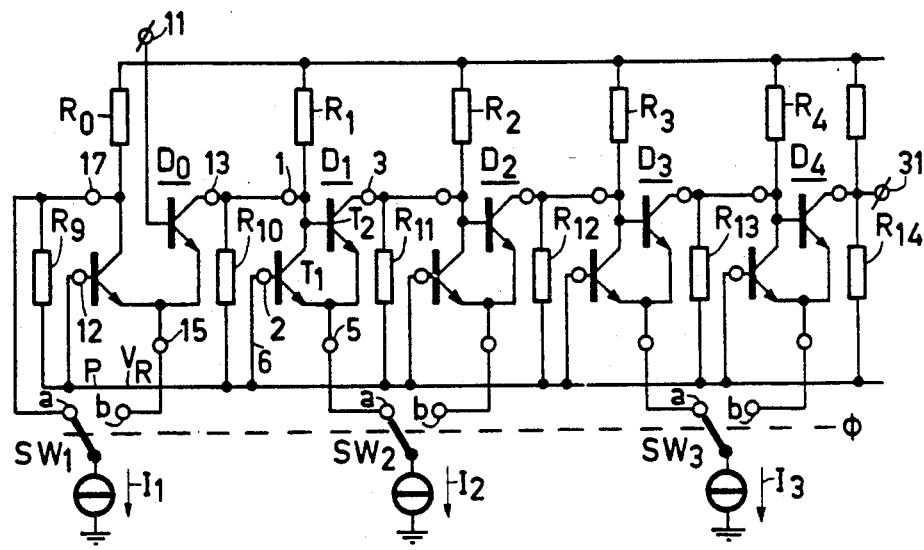
FIG. 3 is the circuit diagram of a variant to the digital shift register in accordance with FIG. 2.

If the shift register in accordance with the invention comprises an even number of bistable circuits and an input threshold circuit as the shift register of FIG. 2, then it is possible, in accordance with the invention, to take such steps that the desired value $V_R = (V_H + V_L)/2$ is complied with exactly. FIG. 3 represents the circuit diagram of a shift register which meets this requirement. The problem is that, regardless of the contents of the shift register, the last bistable circuit produces a 1 on its output 31 when the switches $SW_1 \ldots SW_3$ are in position b, because no further bistable circuit is connected to the output of the last bistable circuit and the information on the output of the last bistable circuit is lost when the switches $SW_1 \ldots SW_3$ are set to position a. In accordance with the invention, the 1 thus produced on the output of the last bistable circuit is now compensated for by producing a 0 on a further output simultaneously with said 1. The further output 17 of the input threshold circuit is suitable for this purpose. During the time that the switches $SW_1 \ldots SW_3$ are in position a the current $I_1$ is applied to said further output 17, so that a 0 is produced on this output, which compensates for the 1 which is simultaneously produced on the output of the last bistable circuit $D_4$.

Figure 4:
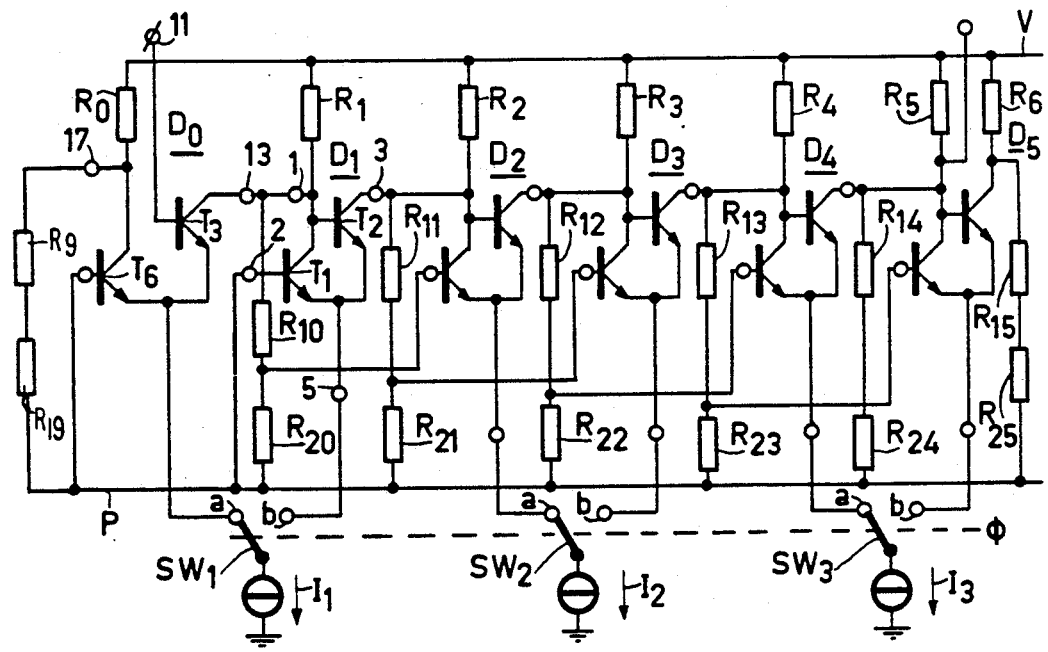
FIG. 4 is the circuit diagram of a further embodiment of the digital shift register in accordance with the invention.

FIG. 4 is the circuit diagram of a further embodiment of the digital shift register in accordance with the invention. This register again comprises the bistable circuits $D_1 \ldots D_5$ and the input threshold circuit $D_0$. In comparison with the circuits of FIGS. 2 and 3 this circuit differs in that the outputs 3 of the bistable circuits $D_1 \ldots D_5$ are each connected to the common node p via the series arrangement of two resistors: the output 3 of the bi-stable circuit $D_1$ via the resistors $R_{11}$ and $R_{21}$, that of the bistable circuit $D_2$ via the resistors $R_{12}$ and $R_{22}$ etc. and the output 13 of the input threshold circuit $D_0$ via the resistors $R_{10}$ and $R_{20}$. The reference input 2 of the bistable circuit $D_1$ is connected to the common node p, the reference input of the bistable circuit $D_2$ is connected to the junction point of the resistors $R_{10}$ and $R_{20}$, the reference input of the bistable circuit $D_3$ is connected to the junction point of the resistors $R_{11}$ and $R_{21}$ etc. If the shift register is used in a divider circuit, i.e. if the output is connected to the input, the reference inputs of $D_0$ and $D_1$ may also be connected to a junction point of resistors in the same way as described in the foregoing for the other stages, i.e. input 2 of $D_1$ to $R_{14}$, $R_{24}$ and the base of transistor $T_6$ to $R_{13}$, $R_{23}$. Said steps improve the operation of the shift register in accordance with the invention. The voltage on the reference input of each of the bistable circuits $D_1 \ldots D_5$ now depends on the state of the bistable circuit preceding it. Since in this type of shift register the information is delayed and inverted in each bistable circuit, this may be regarded as the advanced presentation of inverted information to the reference input of the relevant bistable circuit. Thus, preparations are made for the definitive change-over of a bistable circuit to accelerate this change-over. Assume for example, that the switches $SW_1 \ldots SW_3$ are in position b and that a logic 1, that is a high potential, appears on input 1 of the bistable circuit $D_1$. The output 3 of this bistable circuit will then be at a low potential. The junction point of the resistors $R_{10}$ and $R_{20}$, and thus the reference input of the bistable circuit $D_2$, will then already be at a slightly higher potential, so that when the switches $SW_1 \ldots SW_3$ are set to position a the left-hand transistor of the bistable circuit $D_2$ will be turned on faster than in the case that the reference input were connected to the common node p. If, at the beginning of the switching process now described, a 0 would have appeared on the input 13 of the bistable circuit $D_1$ and consequently a 1 on the output 3, the potential on the reference input of the bistable circuit $D_2$ would have been reduced already, so that upon change-over of the switches $SW_1 \ldots SW_3$ the right-hand transistor of the bistable circuit would have been turned on faster.

In general, the steps described increase the operating speed of the shift register. However, if this is not necessary, it is possible to reduce the power supply current by means of these steps, while the maximum operating speed remains the same as that of the shift register to which the last-mentioned steps have not been applied. Computer simulations have demonstrated that if the voltage division by the registers is 0.3, a current reduction of 20% can be achieved. Moreover, it is advantageous if the resistors $R_9, R_{10}, R_{11} \ldots R_{15}$ have equal values, which is also the case for the resistors $R_{19}, R_{20}, R_{21} \ldots R_{25}$ and the resistors $R_0, R_1, R_2 \ldots R_6$.

By means of the digital shift register just described a frequency divider circuit can be obtained in an advantageous manner by detecting a specific logic state of the outputs of the bistable circuits with an input threshold circuit in the form of a gate circuit. The signal whose frequency is to be divided is then the clock signal $\phi$, by which the switches $SW_1 \ldots SW_3$ are switched.

Figure 5:
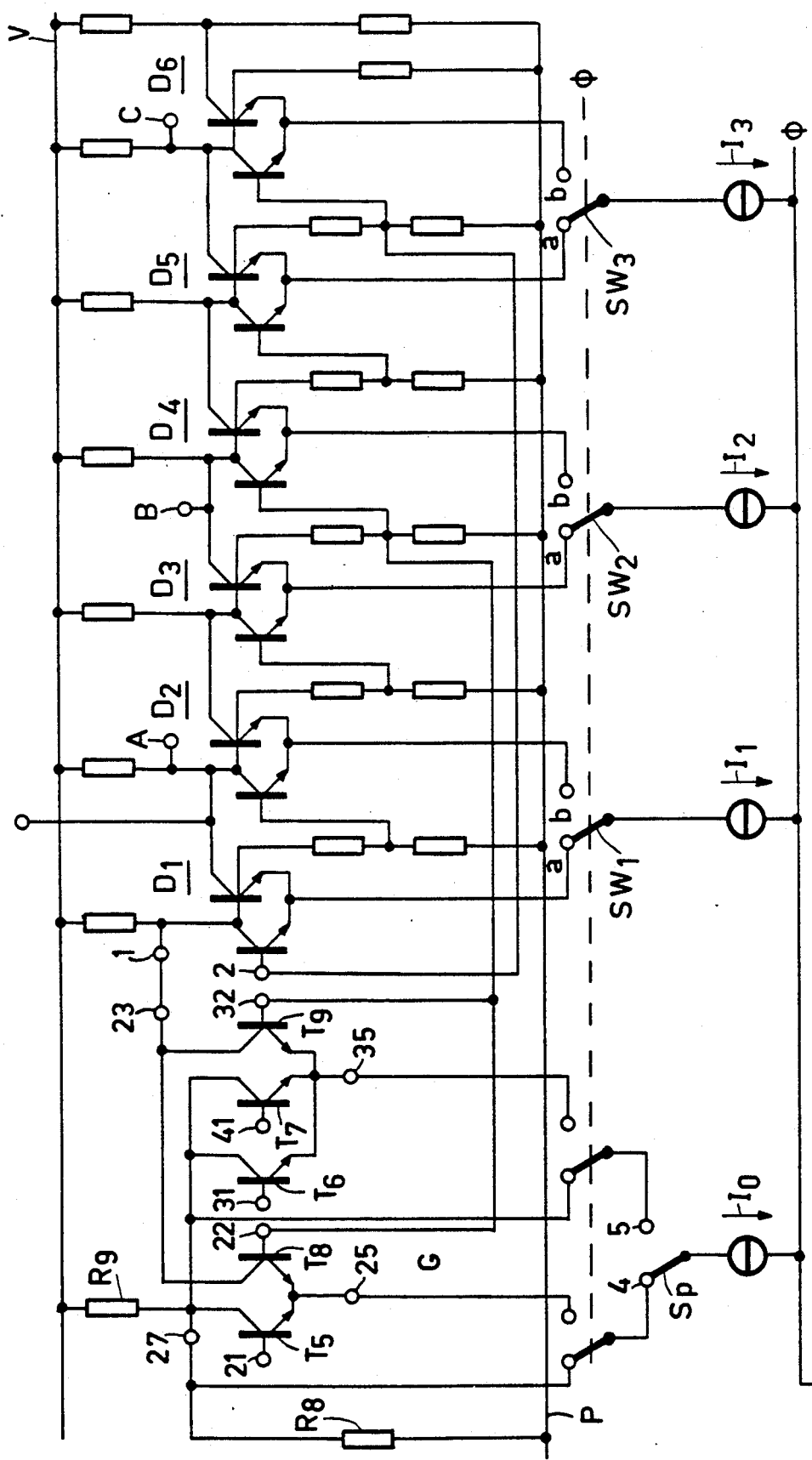
FIG. 5 is the circuit diagram of a frequency divider circuit provided with a digital shift register in accordance with the invention.

FIG. 5 shows the circuit diagram of such a frequency divider circuit provided with a digital shift register in accordance with the invention. This circuit comprises the bistable circuits $D_1 \ldots D_6$, which constitute the actual shift register, for whose operation reference is made to the foregoing. Furthermore, the input gate circuit G has been added. Depending on the position of the switch $S_p$, either the left-hand part with transistors $T_5$ and $T_8$ or the right-hand part with the transistors ($T_6$, $T_7$, $T_9$) of this input gate circuit G is operative.

Connecting the base 21 of transistor $T_5$ to the output B of the bistable circuit $D_3$ yields a ring counter having a cycle time equal to four periods of the clock signal $\phi$, which ring counter is operative when the switch $S_p$ is in position 4. The entire circuit then functions as a divide-by-4 divider. By connecting the base 31 of transistor $T_6$ to output B and the base 41 of transistor $T_7$ to the output C of the bistable circuit $D_5$, a counter is obtained having a cycle time equal to five periods of the clock signal $\phi$. This counter operates as a divide-by-5 divider, when the switch $S_p$ is in position 5. The reference inputs 22, 32 and 2 are connected to different nodes in the manner described in the foregoing, allowance being made for the switching patterns which may occur in the circuit.

The programmable divide-by-4-5 frequency divider circuit described here is merely an example, and it will be evident that by extending or modifying the input gate circuit and/or varying the number of bistable circuits it is possible to manufacture programmable frequency divider circuits of this type with arbitrary divisors.

What is claimed is:

1. A digital shift register having a series of substantially identical bistable circuits, each comprising a signal input, a reference level input, an output, and a clock signal input; the signal inputs of the second and subsequent bistable circuits of the series each being connected to the output of the preceding bistable circuit, the signal input of the first bistable circuit being an input for said digital shift register, and the reference level inputs each being coupled to a common node, the digital shift register also including means for driving the clock signal inputs of each pair of adjacent bistable circuits in the series alternately with current pulses under the influence of a clock signal, characterized in that the output of the bistable circuits are each connected to the common node via a respective resistance in order to generate a reference potential at said common node.

2. A digital shift register as claimed in claim 1, characterized in that it comprises an input threshold circuit, having a signal input, a clock signal input, and a first output connected to the signal input of the first bistable circuit of the series, the clock signal input of the input threshold circuit and the clock signal input of said first bistable circuit being alternately drivable with current pulses under the influence of the clock signal; the input threshold circuit further comprising a reference level input connected to the common node, and a second output, on which a logic signal is available, which logic signal, at least when current is applied to the clock signal input of the input threshold circuit, is the inverse of a signal on the first output of the input threshold circuit, the outputs of the input threshold circuit each being connected to the common node via respective further resistances.

3. A digital shift register as claimed in claim 2, characterized in that it includes means for driving said second output with current pulses, which are in phase with the current pulses applied to the clock signal input of the first bistable circuit.

4. A digital shift register as claimed in claim 2 or 3, characterized in that said respective resistances and further resistances each include an intermediate tap, the reference level inputs of the second and subsequent bistable circuits, respectively, being connected to the intermediate taps of the resistances at the first output of the input threshold circuit and at the outputs of the first and subsequent bistable circuits, respectively.

5. A digital shift register as claimed in claim 4, characterized in that each said further resistance is provided with a tapping, the coupling from the reference level input of the first bi-stable circuit to the reference level point comprising a connection from this reference level input to the tapping of the resistance connecting said second output to the reference potential point, and the coupling from the reference level input of the second bistable circuit to the reference potential point comprising a connection from this reference level input to the tapping on the resistance connecting said first output to said reference potential point.

6. A digital shift register as claimed in claim 1, characterized in that each of the bistable circuits comprises first and second transistors of the same conductivity type, the emitters thereof being interconnected and connected to the corresponding clock signal input, the base of the first transistor being connected to the corresponding reference level input, the base of the second transistor being connected to the collector of the first transistor and the corresponding signal input, said signal input being connected, via a respective resistor, to a power supply terminal (V) which is common to all bistable circuits, and the collector of the second transistor being connected to the corresponding output.

7. A digital shift register as claimed in claim 2, characterized in that the input threshold circuit comprises first and second transistors of the same conductivity type, the emitters thereof being interconnected and connected to the clock signal input of the input threshold circuit, the collector of the first transistor being connected to the first output of the input threshold circuit, and the collector of the second transistor being connected to the second output of the input threshold circuit, which second output is connected to the power-supply terminal (V) via a further resistor ($R_0$).

8. A digital shift register as claimed in claim 7, characterized in that the base of the second transistor is connected to the common node and the base of the first transistor is connected to the register input.

9. A programmable frequency divider including a digital shift register as claimed in claim 1, characterized in that said divider further comprises an input gate circuit for the formation of a programmable shift register, the input gate circuit comprising a plurality of signal inputs, which are each connectable to the output of one of the bistable circuits, a plurality of reference level inputs, which are each connected to the reference level input of one of the bistable circuits, a first output connected to the input of the first bistable circuit, a second output connected to the common node via a resistor, and at least two clock signal inputs, one input of which, depending on the position of a selector switch, can be driven with current pulses which are in phase opposition to the current pulses applied to the clock signal input of the first bistable circuit and the second output can be driven with current pulses which are in phase with the current pulses applied to the clock input of the first bistable circuit.

10. A programmable frequency divider as claimed in claim 9, characterized in that the input gate circuit comprises first, second, third fourth and fifth transistors, in which the bases of the first, second and third transistor are each connected to one of the signal inputs of the input gate circuit, the bases of the fourth and fifth transistors are connected to a reference level input of the input gate circuit, the emitters of the first and the fourth transistors are interconnected and connected to one of the clock signal inputs of the input gate circuit, the emitters of the second, third and fifth transistors are interconnected and are connected to a further clock signal input of the input gate circuit, the collectors of the first, second and third transistors are interconnected and connected to the second output, which, via a resistor, is connected to a power-supply terminal, and the collectors of the fourth and fifth transistors are interconnected and connected to the first output of the input gate circuit.

* * * * *